(12) United States Patent
Ma et al.

(10) Patent No.: US 11,437,347 B2
(45) Date of Patent: Sep. 6, 2022

(54) HYBRID MEMORY STRUCTURE

(71) Applicant: Powerchip Semiconductor Manufacturing Corporation, Hsinchu (TW)

(72) Inventors: Chen-Liang Ma, Taoyuan (TW); Zih-Song Wang, Nantou County (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 117 days.

(21) Appl. No.: 17/033,945

(22) Filed: Sep. 28, 2020

(65) Prior Publication Data

US 2022/0068878 A1 Mar. 3, 2022

(30) Foreign Application Priority Data

Sep. 3, 2020 (TW) ................................ 109130199

(51) Int. Cl.
*H01L 27/11563* (2017.01)
*H01L 25/065* (2006.01)
*H01L 27/24* (2006.01)
*H01L 27/11558* (2017.01)

(52) U.S. Cl.
CPC .... *H01L 25/0652* (2013.01); *H01L 27/11558* (2013.01); *H01L 27/11563* (2013.01); *H01L 27/24* (2013.01)

(58) Field of Classification Search
CPC ............ G11C 2213/32; G11C 11/5685; H01L 45/145–1691; H01L 45/1266–14; H01L 45/12–1253; H01L 45/08
See application file for complete search history.

(56) References Cited

U.S. PATENT DOCUMENTS 8,451,646 B2 * 5/2013 Chi ..................... G11C 13/0007
365/185.05
9,825,224 B2 * 11/2017 Hsieh ..................... H01L 45/124
10,217,512 B1 2/2019 Leobandung
(Continued)

FOREIGN PATENT DOCUMENTS

| CN | 102298970 | 12/2011 |
| TW | 201203248 | 1/2012 |
| TW | 201528438 | 7/2015 |

OTHER PUBLICATIONS

Office Action of Taiwan Counterpart Application, dated Mar. 15, 2021, pp. 1-8.
(Continued)

*Primary Examiner* — Jarrett J Stark
(74) *Attorney, Agent, or Firm* — JCIPRNET (57) ABSTRACT

A hybrid memory structure including a substrate, a flash memory, a first resistive random access memory (RRAM), and a second RRAM is provided. The flash memory is located on the substrate. The flash memory includes a gate, a first doped region, and a second doped region. The gate is located on the substrate. The first doped region is located in the substrate on one side of the gate. The second doped region is located in the substrate on another side of the gate. The first RRAM is electrically connected to one of the gate, the first doped region, and the second doped region. The second RRAM is electrically connected to another of the gate, the first doped region, and the second doped region.

19 Claims, 5 Drawing Sheets

(56) References Cited

U.S. PATENT DOCUMENTS

| | | | |
|---|---|---|---|
| 10,396,126 B1* | 8/2019 | Kim | H01L 45/1683 |
| 10,636,842 B1* | 4/2020 | Cheng | H01L 27/2463 |
| 10,840,299 B2* | 11/2020 | Liu | H01L 27/2436 |
| 10,950,302 B1* | 3/2021 | Wu | H01L 27/2463 |
| 10,950,661 B2* | 3/2021 | Wang | H01L 45/1616 |
| 11,049,904 B1* | 6/2021 | Huang | H01L 45/1683 |
| 2004/0114428 A1* | 6/2004 | Morikawa | G11C 13/003 365/158 |
| 2008/0185568 A1* | 8/2008 | Kwon | H01L 27/24 438/102 |
| 2009/0020745 A1* | 1/2009 | Jeong | G11C 13/003 257/E47.001 |
| 2009/0027955 A1* | 1/2009 | Koh | H01L 27/2481 438/102 |
| 2009/0073741 A1* | 3/2009 | Liu | G11C 13/0004 257/E47.001 |
| 2010/0259976 A1* | 10/2010 | Abedifard | G11C 8/16 365/171 |
| 2011/0051496 A1* | 3/2011 | Chi | G11C 13/0007 365/148 |
| 2012/0068148 A1* | 3/2012 | Kawashima | H01L 45/1675 257/E47.001 |
| 2013/0094282 A1* | 4/2013 | Hu | G11C 11/16 365/158 |
| 2013/0107606 A1* | 5/2013 | Katoh | G11C 11/4125 365/148 |
| 2013/0130469 A1* | 5/2013 | Liu | G11C 13/0004 438/382 |
| 2013/0256778 A1* | 10/2013 | Sim | H01L 29/40114 257/421 |
| 2013/0258750 A1* | 10/2013 | Kim | G11C 11/1659 365/158 |
| 2014/0021584 A1* | 1/2014 | Tu | H01L 23/5223 257/532 |
| 2014/0077144 A1* | 3/2014 | Yoneda | H01L 45/1683 257/2 |
| 2014/0078808 A1* | 3/2014 | Hashim | H01L 27/2436 257/4 |
| 2014/0166959 A1* | 6/2014 | Bertin | H01L 29/861 257/2 |
| 2014/0225054 A1* | 8/2014 | Yoneda | H01L 45/08 257/4 |
| 2014/0225055 A1* | 8/2014 | Herner | H01L 45/16 257/4 |
| 2014/0321197 A1* | 10/2014 | Ninomiya | G11C 13/0069 365/148 |
| 2015/0137066 A1* | 5/2015 | Lee | G11C 16/06 257/5 |
| 2015/0221699 A1* | 8/2015 | Lee | H01L 43/02 257/252 |
| 2015/0248931 A1* | 9/2015 | Nazarian | G11C 11/56 438/238 |
| 2015/0380063 A1* | 12/2015 | Chang | G11C 13/0007 365/72 |
| 2016/0043136 A1* | 2/2016 | Kim | H01L 27/228 257/295 |
| 2017/0092693 A1* | 3/2017 | Tan | H01L 43/12 |
| 2018/0166135 A1* | 6/2018 | McCollum | H03K 19/1776 |
| 2018/0205013 A1* | 7/2018 | Yi | H01L 45/1683 |
| 2019/0019551 A1* | 1/2019 | Lee | G11C 11/5685 |
| 2019/0058007 A1* | 2/2019 | Tsai | G11C 11/1659 |
| 2019/0164602 A1* | 5/2019 | Tu | H01L 45/147 |
| 2020/0006649 A1* | 1/2020 | Jiang | H01L 45/1253 |
| 2020/0027504 A1* | 1/2020 | Sharma | H01L 45/16 |
| 2020/0066726 A1* | 2/2020 | Fishburn | H01L 29/78 |
| 2020/0083294 A1* | 3/2020 | Yang | H01L 29/66659 |
| 2020/0357991 A1* | 11/2020 | Fang | H01L 45/1253 |
| 2021/0057643 A1* | 2/2021 | Chou | H01L 45/1233 |
| 2021/0217813 A1* | 7/2021 | Wang | H01L 45/1233 |
| 2021/0249596 A1* | 8/2021 | Bao | H01L 45/1683 |
| 2022/0068878 A1* | 3/2022 | Ma | H01L 27/11526 |
| 2022/0083260 A1* | 3/2022 | Lee | G11C 7/22 |

OTHER PUBLICATIONS

Sung Hyun Jo et al., "Cross-Point Resistive RAM Based on Field-Assisted Superlinear Threshold Selector", IEEE Transactions On Electron Devices, vol. 62, No. 11, Nov. 2015, pp. 3477-3481.

Mark Webb, "Markets for 3D-Xpoint Applications, Performance and Revenue", Flash Memory Summit 2018 Santa Clara, CA, Aug. 2018, pp. 1-17.

\* cited by examiner

HYBRID MEMORY STRUCTURE

CROSS-REFERENCE TO RELATED APPLICATION

This application claims the priority benefit of Taiwan application serial no. 109130199, filed on Sep. 3, 2020. The entirety of the above-mentioned patent application is hereby incorporated by reference herein and made a part of this specification.

BACKGROUND OF THE INVENTION

Field of the Invention

The invention relates to a semiconductor structure, and particularly relates to a hybrid memory structure.

Description of Related Art

Since the resistive random access memory (RRAM) has the problem of leakage current, the RRAM is electrically connected to the transistor to solve the problem of leakage current. However, since the transistor occupies a large area of the chip, the bit density of the memory device is reduced.

SUMMARY OF THE INVENTION

The invention provides a hybrid memory structure, which can increase the reliability and the bit density of the memory device.

The invention provides a hybrid memory structure, which includes a substrate, a flash memory, a first RRAM, and a second RRAM. The flash memory is located on the substrate. The flash memory includes a gate, a first doped region, and a second doped region. The gate is located on the substrate. The first doped region is located in the substrate on one side of the gate. The second doped region is located in the substrate on another side of the gate. The first RRAM is electrically connected to one of the gate, the first doped region, and the second doped region. The second RRAM is electrically connected to another of the gate, the first doped region, and the second doped region.

According to an embodiment of the invention, in the hybrid memory structure, the flash memory may further include a charge storage layer, a first dielectric layer, and a second dielectric layer. The charge storage layer is located between the gate and the substrate. The first dielectric layer is located between the charge storage layer and the substrate. The second dielectric layer is located between the gate and the charge storage layer.

According to an embodiment of the invention, in the hybrid memory structure, the charge storage layer may be a floating gate or a charge trapping layer.

According to an embodiment of the invention, in the hybrid memory structure, the flash memory may further include a first lightly doped drain (LDD), a second LDD, and a well region. The first LDD is located in the substrate between the first doped region and the gate. The second LDD is located in the substrate between the second doped region and the gate. The well region is located in the substrate. The first doped region, the second doped region, the first LDD, and the second LDD are located in the well region.

According to an embodiment of the invention, in the hybrid memory structure, the flash memory may further include a spacer. The spacer is located on the sidewall of the gate.

According to an embodiment of the invention, in the hybrid memory structure, the height of the top of the first RRAM may be equal to the height of the top of the second RRAM.

According to an embodiment of the invention, in the hybrid memory structure, the height of the top of the first RRAM may be higher than the height of the top of the second RRAM.

According to an embodiment of the invention, in the hybrid memory structure, the height of the top of the first RRAM may be lower than the height of the top of the second RRAM.

According to an embodiment of the invention, in the hybrid memory structure, the first RRAM includes a first electrode, a second electrode, and a first variable resistance layer. The second electrode is located on the first electrode. The first variable resistance layer is located between the first electrode and the second electrode. The second RRAM includes a third electrode, a fourth electrode, and a second variable resistance layer. The fourth electrode is located on the third electrode. The second variable resistance layer is located between the third electrode and the fourth electrode.

According to an embodiment of the invention, in the hybrid memory structure, the first RRAM may be electrically connected to the gate, and the second RRAM may be electrically connected to the second doped region.

According to an embodiment of the invention, in the hybrid memory structure, the first electrode may be electrically connected to the gate. The third electrode may be electrically connected to the second doped region.

According to an embodiment of the invention, the hybrid memory structure may further include a first conductive line, a second conductive line, a third conductive line, and a fourth conductive line. The first conductive line is electrically connected to the first electrode. The second conductive line is electrically connected to the second electrode. The third conductive line is electrically connected to the fourth electrode. The fourth conductive line is electrically connected to the first doped region.

According to an embodiment of the invention, in the hybrid memory structure, the first RRAM may be electrically connected to the gate, and the second RRAM may be electrically connected to the first doped region.

According to an embodiment of the invention, in the hybrid memory structure, the first electrode may be electrically connected to the gate. The third electrode may be electrically connected to the first doped region.

According to an embodiment of the invention, the hybrid memory structure may further include a first conductive line, a second conductive line, a third conductive line, and a fourth conductive line. The first conductive line is electrically connected to the first electrode. The second conductive line is electrically connected to the second electrode. The third conductive line is electrically connected to the fourth electrode. The fourth conductive line is electrically connected to the second doped region.

According to an embodiment of the invention, in the hybrid memory structure, the first RRAM may be electrically connected to the first doped region, and the second RRAM may be electrically connected to the second doped region.

According to an embodiment of the invention, in the hybrid memory structure, the first electrode may be electrically connected to the first doped region. The third electrode may be electrically connected to the second doped region.

According to an embodiment of the invention, the hybrid memory structure may further include a first conductive line, a second conductive line, and a third conductive line. The first conductive line is electrically connected to the second electrode. The second conductive line is electrically connected to the fourth electrode. The third conductive line is electrically connected to the gate.

According to an embodiment of the invention, in the hybrid memory structure, the material of the first electrode, the second electrode, the third electrode, and the fourth electrode is, for example, titanium (Ti), tantalum (Ta), platinum (Pt), iridium (Ir), ruthenium (Ru), tungsten (W), aluminum (Al), zirconium (Zr), hafnium (HO, nickel (Ni), copper (Cu), cobalt (Co), iron (Fe), gadolinium (Gd), manganese (Mo), titanium nitride (TiN), tantalum nitride (TaN), titanium aluminum nitride (TiAlN), titanium tungsten (TiW) alloy, or a combination thereof.

According to an embodiment of the invention, in the hybrid memory structure, the material of the first variable resistance layer and the second variable resistance layer is, for example, hafnium oxide ($HfO_2$), tantalum oxide ($Ta_2O_5$), titanium oxide ($TiO_2$), magnesium oxide (MgO), nickel oxide (NiO), niobium oxide ($Nb_2O_5$), aluminum oxide ($Al_2O_3$), vanadium oxide ($V_2O_5$), tungsten oxide ($WO_3$), zinc oxide (ZnO), cobalt oxide (CoO), or a combination thereof.

Based on the above description, in the hybrid memory structure according to the invention, since the first RRAM and the second RRAM are electrically connected to the flash memory, respectively, the problem of leakage current of the first RRAM and the second RRAM can be prevented, thereby increasing the reliability of the RRAM. In addition, since the flash memory is electrically connected to the first RRAM and the second RRAM, the flash memory can be prevented from being affected by factors such as coupling or disturbance, thereby increasing the reliability of the flash memory. Furthermore, since a single memory cell of the hybrid memory structure includes the flash memory, the first RRAM, and the second RRAM, the bit density of the memory device can be increased, and the electrical performance of the single level cell (SLC) can be maintained. On the other hand, the manufacturing process of the hybrid memory structure according to the invention can be compatible with the manufacturing process of the complementary metal-oxide-semiconductor (CMOS) device.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
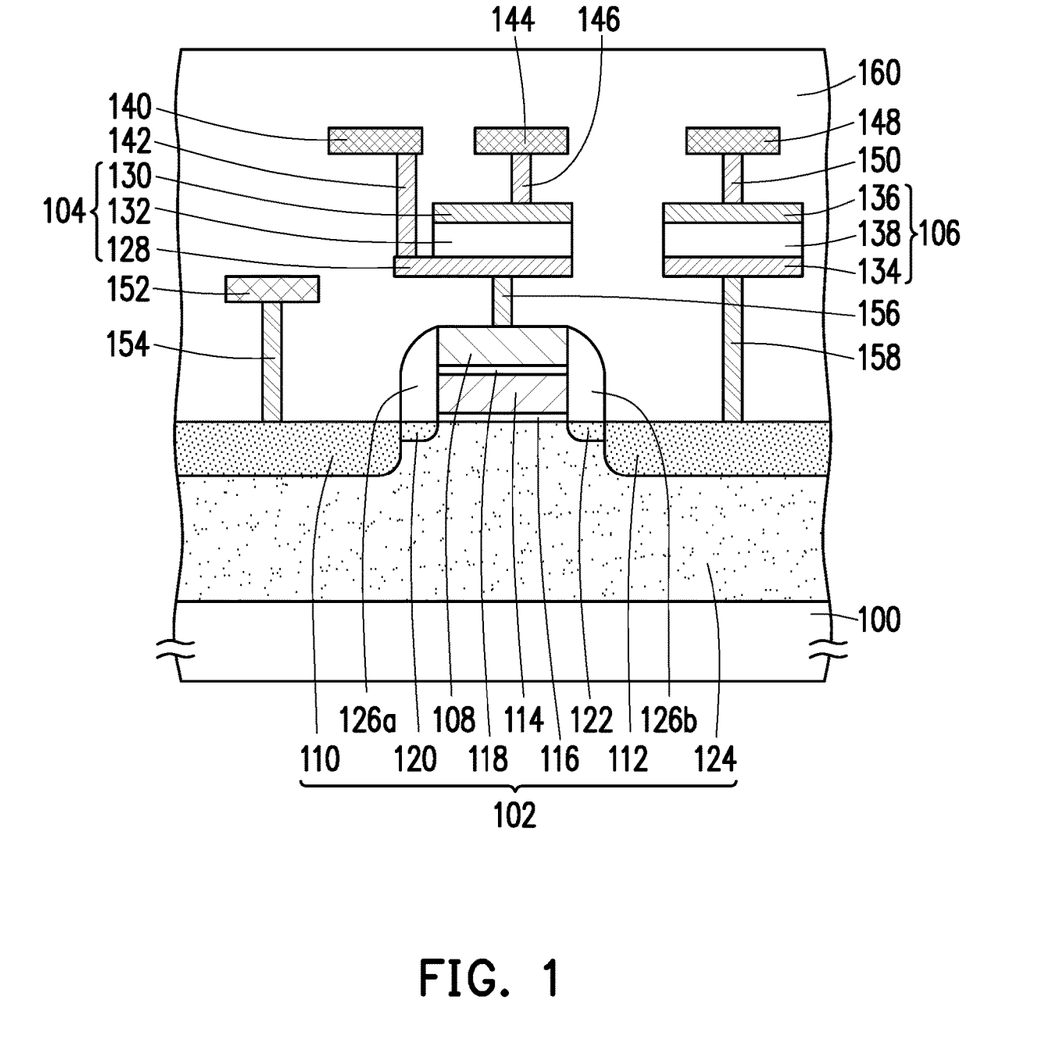
FIG. 1 is a cross-sectional view illustrating a hybrid memory structure according to an embodiment of the invention.
Figure 2:
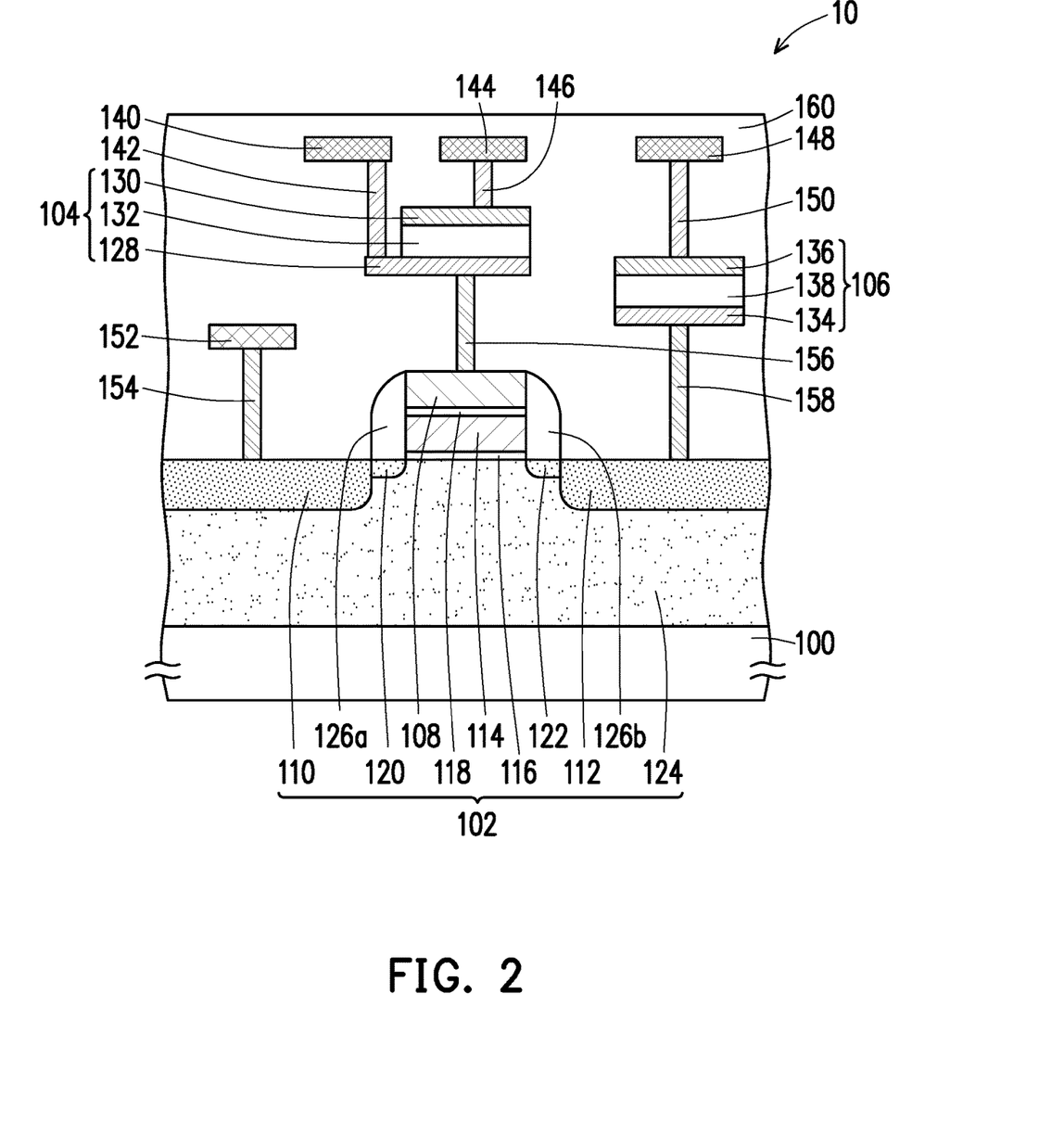
FIG. 2 is a cross-sectional view illustrating a hybrid memory structure according to another embodiment of the invention.
Figure 3:
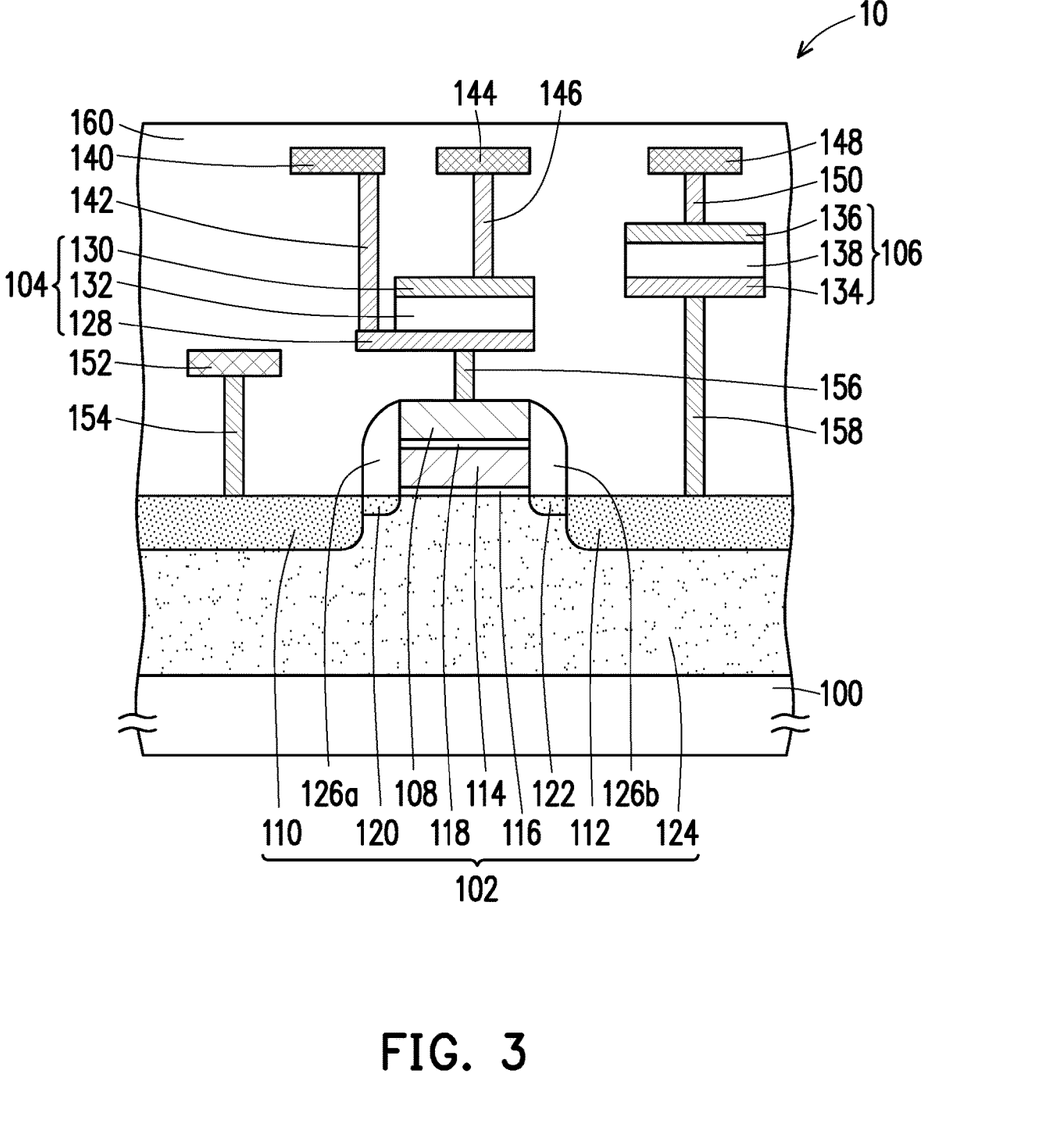
FIG. 3 is a cross-sectional view illustrating a hybrid memory structure according to another embodiment of the invention.

FIG. 1 is a cross-sectional view illustrating a hybrid memory structure according to an embodiment of the invention. FIG. 2 is a cross-sectional view illustrating a hybrid memory structure according to another embodiment of the invention. FIG. 3 is a cross-sectional view illustrating a hybrid memory structure according to another embodiment of the invention.

Referring to FIG. 1, a hybrid memory structure 10 includes a substrate 100, a flash memory 102, a RRAM 104, and a RRAM 106. The flash memory 102 is located on substrate 100. The substrate 100 may be a semiconductor substrate, such as a silicon substrate. In addition, in the circuit, the flash memory 102, the RRAM 104, and the RRAM 106 may be three resistors connected in series. In some embodiments, the flash memory 102, the RRAM 104, and the RRAM 106 may have the same resistance value.

The flash memory 102 includes a gate 108, a doped region 110, and a doped region 112. The gate 108 is located on substrate 100. The material of the gate 108 is, for example, doped polysilicon. The doped region 110 is located in the substrate 100 on one side of the gate 108. The doped region 112 is located in the substrate 100 on another side of the gate 108. The doped region 110 and the doped region 112 may be used as a source or a drain, respectively. In the present embodiment, the doped region 110 is, for example, used as the source, and the doped region 112 is, for example, used as the drain, but the invention is not limited thereto.

Furthermore, the flash memory 102 may further include at least one of a charge storage layer 114, a dielectric layer 116, a dielectric layer 118, a LDD 120, a LDD 122, a well region 124, a spacer 126a, and a spacer 126b. The charge storage layer 114 is located between the gate 108 and the substrate 100. The charge storage layer 114 may be a floating gate or a charge trapping layer. The material of the floating gate is, for example, doped polysilicon. The material of the charge trapping layer is, for example, silicon nitride. The dielectric layer 116 is located between the charge storage layer 114 and the substrate 100. The material of the dielectric layer 116 is, for example, silicon oxide. The dielectric layer 118 is located between the gate 108 and the charge storage layer 114. The material of the dielectric layer 118 is, for example, silicon oxide.

The LDD 120 is located in the substrate 100 between the doped region 110 and the gate 108. The LDD 122 is located in the substrate 100 between the doped region 112 and the gate 108. The well region 124 is located in the substrate 100. The doped region 110, the doped region 112, the LDD 120, and the LDD 122 are located in the well region 124. The doped region 110, the doped region 112, the LDD 120, and the LDD 122 may be a first conductive type, and the well region 124 may be a second conductive type. The first conductive type and the second conductive type are different conductive types. That is, the first conductive type and the second conductive type may be one and the other of the N-type conductive type and the P-type conductive type, respectively. The spacer 126a and the spacer 126b are located on the sidewall of the gate 108. The LDD 120 and the LDD 122 may be located below the spacer 126a and the spacer 126b, respectively. The spacer 126a and the spacer 126b may be a single-layer structure or a multilayer structure. The material of the spacer 126a and the spacer 126b is, for example, silicon oxide, silicon nitride, or a combination thereof.

The RRAM 104 is electrically connected to one of the gate 108, the doped region 110, and the doped region 112. In the present embodiment, the RRAM 104 may be electrically connected to the gate 108 of the flash memory 102, but the invention is not limited thereto.

The RRAM 104 includes an electrode 128, an electrode 130, and a variable resistance layer 132. The electrode 128 may be electrically connected to the gate 108. The electrode 130 is located on the electrode 128. The width of the electrode 128 may be greater than the width of the electrode 130 to facilitate the subsequent interconnect process, but the invention is not limited thereto. The material of the electrode 128 and the electrode 130 may be metal or metal nitride, such as titanium, tantalum, platinum, iridium, ruthenium, tungsten, aluminum, zirconium, hafnium, nickel, copper, cobalt, iron, gadolinium, manganese, titanium nitride, tantalum nitride, titanium aluminum nitride, titanium tungsten alloy, or a combination thereof. The variable resistance layer 132 is located between the electrode 128 and the electrode 130. The material of the variable resistance layer 132 may be a metal oxide, such as a transition metal oxide. The material of the variable resistance layer 132 is, for example, hafnium oxide, tantalum oxide, titanium oxide, magnesium oxide, nickel oxide, niobium oxide, aluminum oxide, vanadium oxide, tungsten oxide, zinc oxide, cobalt oxide, or a combination thereof.

The RRAM 106 is electrically connected to another of the gate 108, the doped region 110, and the doped region 112. In the present embodiment, the RRAM 106 may be electrically connected to the doped region 112 of the flash memory 102, but the invention is not limited thereto.

The RRAM 106 includes an electrode 134, an electrode 136, and a variable resistance layer 138. The electrode 134 may be electrically connected to the doped region 112. The electrode 136 is located on electrode 134. The material of the electrode 134 and the electrode 136 may be metal or metal nitride, such as titanium, tantalum, platinum, iridium, ruthenium, tungsten, aluminum, zirconium, hafnium, nickel, copper, cobalt, iron, gadolinium, manganese, titanium nitride, tantalum nitride, titanium aluminum nitride, titanium tungsten alloy, or a combination thereof. The variable resistance layer 138 is located between the electrode 134 and the electrode 136. The material of the variable resistance layer 138 may be a metal oxide, such as a transition metal oxide. The material of the variable resistance layer 138 is, for example, hafnium oxide, tantalum oxide, titanium oxide, magnesium oxide, nickel oxide, niobium oxide, aluminum oxide, vanadium oxide, tungsten oxide, zinc oxide, cobalt oxide, or a combination thereof.

In addition, the hybrid memory structure 10 may further include at least one of a conductive line 140, a via 142, a conductive line 144, a via 146, a conductive line 148, a via 150, a conductive line 152, a contact 154, a contact 156, and a contact 158. The conductive line 140 is electrically connected to the electrode 128. The via 142 is electrically connected between the conductive line 140 and the electrode 128, so that the conductive line 140 can be electrically connected to the electrode 128. The conductive line 144 is electrically connected to the electrode 130. The via 146 is electrically connected between the conductive line 144 and the electrode 130, so that the conductive line 144 can be electrically connected to the electrode 130. The conductive line 148 is electrically connected to the electrode 136. The via 150 is electrically connected between the conductive line 148 and the electrode 136, so that the conductive line 148 can be electrically connected to the electrode 136. The conductive line 152 is electrically connected to the doped region 110. The contact 154 is electrically connected between the conductive line 152 and the doped region 110, so that the conductive line 152 can be electrically connected to the doped region 110. The contact 156 is electrically connected between the electrode 128 and the gate 108, so that the electrode 128 can be electrically connected to the gate 108. The contact 158 is electrically connected between the electrode 134 and the doped region 112, so that the electrode 134 can be electrically connected to the doped region 112. The material of the conductive line 140, the conductive line 144, the conductive line 148, and the conductive line 152 is, for example, metal such as aluminum. The material of the via 142, the via 146, the via 150, the contact 154, the contact 156, and the contact 158 is, for example, metal such as tungsten.

However, the interconnection structures (e.g., the via 142, the via 146, the via 150, the contact 154, the contact 156, and the contact 158) in FIG. 1 are only examples, but the invention is not limited thereto. One of ordinary skill in the art can adjust the interconnection structures according to product requirements, such as adding additional conductive lines and vias.

In the present embodiment, the RRAM 104 may be operated through the conductive line 140 and the conductive line 144. For example, by setting the voltages of the conductive line 140 and the conductive line 144, the conductive filament can be formed in the variable resistance layer 132 to change the resistance value of the variable resistance layer 132. Moreover, the RRAM 106 may be operated through the conductive line 148 and the well region 124. For example, by setting the voltages of the conductive line 148 and the well region 124, the conductive filament can be formed in the variable resistance layer 138 to change the resistance value of the variable resistance layer 138.

Furthermore, the hybrid memory structure 10 may further include a dielectric structure 160. In the hybrid memory structure 10, the aforementioned components located above the substrate 100 may be located in the dielectric structure 160. The dielectric structure 160 may be a multilayer structure. The material of the dielectric structure 160 is, for example, silicon oxide, silicon nitride, silicon oxynitride, or a combination thereof.

In the present embodiment, the height of the top of the RRAM 104 may be equal to the height of the top of the RRAM 106, so that the RRAM 104 and the RRAM 106 may be simultaneously formed by the same process, but the invention is not limited thereto. In other embodiments, the height of the top of the RRAM 104 may be higher than the height of the top of the RRAM 106 (FIG. 2), or the height of the top of the RRAM 104 may be lower than the height of the top of the RRAM 106 (FIG. 3).

Based on the above embodiments, in the hybrid memory structure 10, since the RRAM 104 and the RRAM 106 are electrically connected to the flash memory 102, respectively, the problem of leakage current of the RRAM 104 and the RRAM 106 can be prevented, thereby increasing the reliability of the RRAM 104 and the RRAM 106. In addition, since the flash memory 102 is electrically connected to the RRAM 104 and the RRAM 106, the flash memory 102 can be prevented from being affected by factors such as coupling or disturbance, thereby increasing the reliability of the flash memory 102. Furthermore, since a single memory cell of the hybrid memory structure 10 includes the flash memory 102, the RRAM 104, and the RRAM 106, the bit density of the memory device can be increased (at least having the bit density of the triple level cell (TLC)), and the electrical performance of the single level cell (SLC) can be maintained. On the other hand, the manufacturing process of the hybrid memory structure 10 can be compatible with the manufacturing process of the complementary metal-oxide-semiconductor (CMOS) device.

Figure 4:
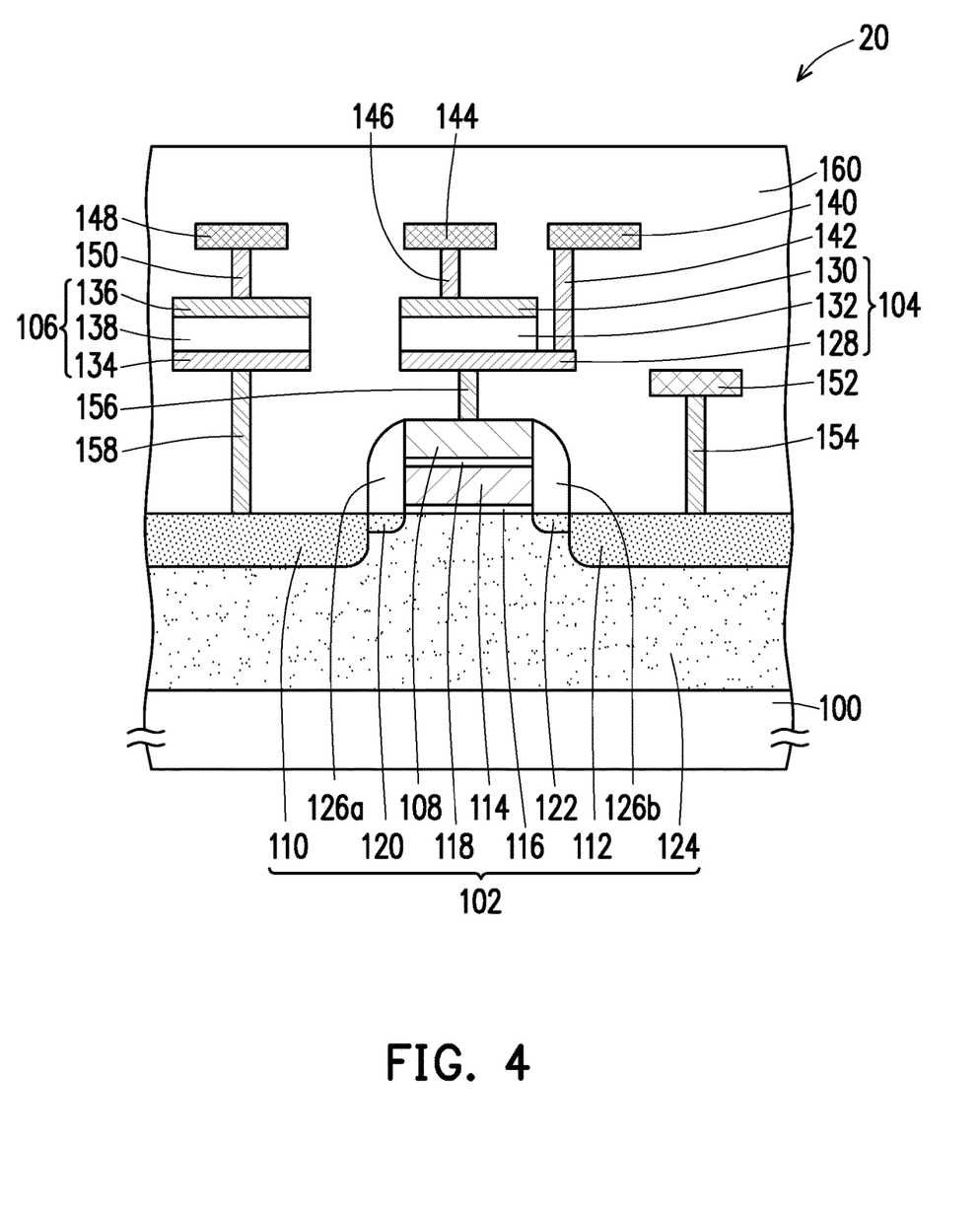
FIG. 4 is a cross-sectional view illustrating a hybrid memory structure according to another embodiment of the invention.

FIG. 4 is a cross-sectional view illustrating a hybrid memory structure according to another embodiment of the invention.

Referring to FIG. 1 and FIG. 4, the difference between the hybrid memory structure 20 of FIG. 4 and the hybrid memory structure 10 of FIG. 1 is as follows. Referring to FIG. 4, in the hybrid memory structure 20, the RRAM 106 may be electrically connected to the doped region 110, and the conductive line 152 may be electrically connected to the doped region 112. For example, in the hybrid memory structure 20, the electrode 134 of the RRAM 106 may be electrically connected to the doped region 110 through the contact 158, and the conductive line 152 may be electrically connected to the doped region 112 through the contact 154. In the hybrid memory structure 20, although the height of the top of the RRAM 104 is, for example, equal to the height of the top of the RRAM 106, the invention is not limited thereto. In other embodiments, the height of the top of the RRAM 104 may be higher or lower than the height of the top of the RRAM 106. In addition, in the hybrid memory structure 10 of FIG. 1 and the hybrid memory structure 20 of FIG. 4, the same or similar components are denoted by the same symbols, and the description thereof is omitted here.

Based on the above embodiments, in the hybrid memory structure 20, since the RRAM 104 and the RRAM 106 are electrically connected to the flash memory 102, respectively, the reliability of the RRAM 104, the RRAM 106, and the flash memory 102 can be increased, the bit density of the memory device can be increased, and the electrical performance of the SLC can be maintained. On the other hand, the manufacturing process of the hybrid memory structure 20 can be compatible with the manufacturing process of the CMOS device.

Figure 5:
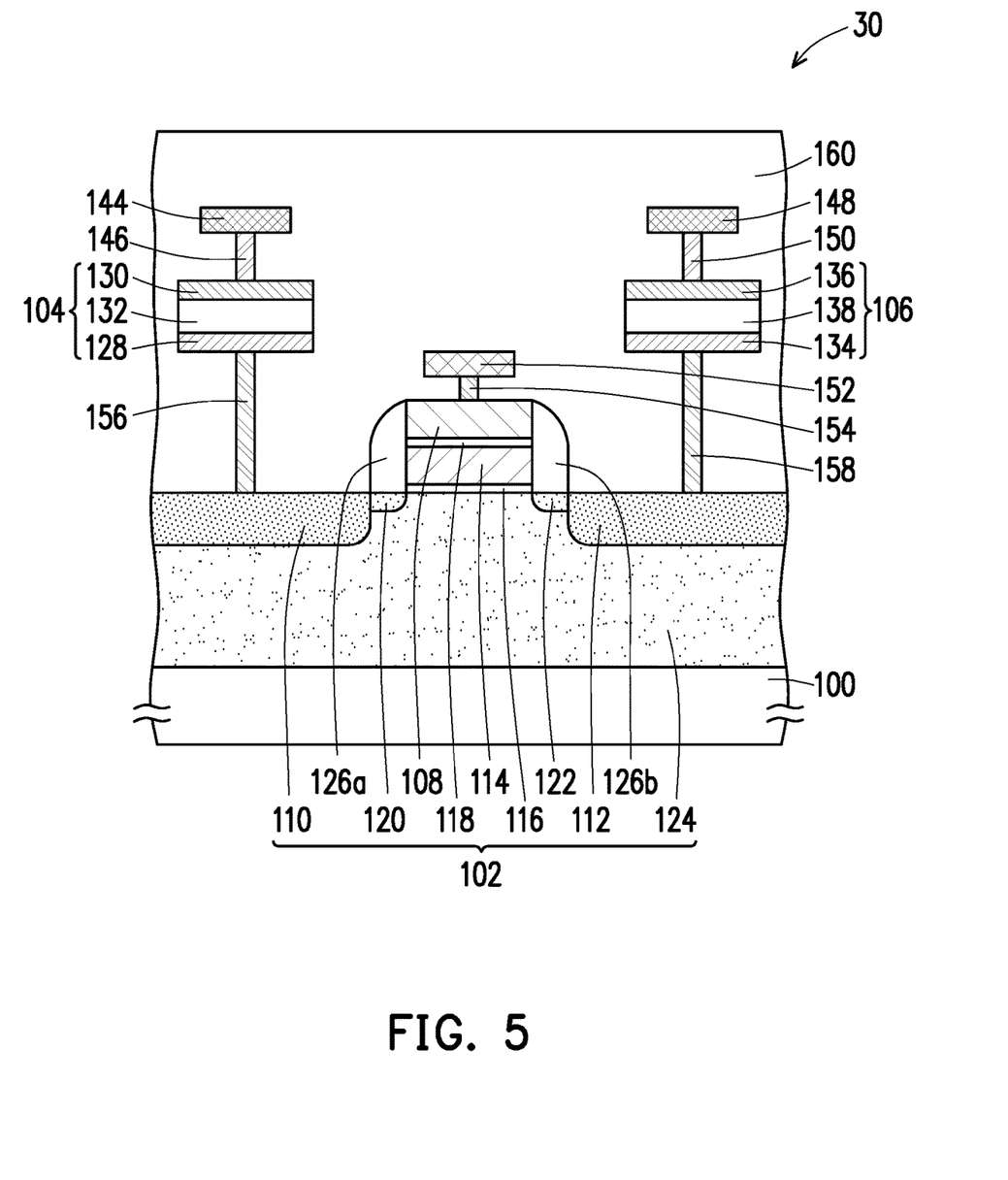
FIG. 5 is a cross-sectional view illustrating a hybrid memory structure according to another embodiment of the invention.

FIG. 5 is a cross-sectional view illustrating a hybrid memory structure according to another embodiment of the invention.

Referring to FIG. 1 and FIG. 5, the difference between the hybrid memory structure 30 of FIG. 5 and the hybrid memory structure 10 of FIG. 1 is as follows. Referring to FIG. 5, in the hybrid memory structure 30, the RRAM 104 may be electrically connected to the doped region 110, and the conductive line 152 may be electrically connected to the gate 108. For example, in the hybrid memory structure 30, the electrode 128 of the RRAM 104 may be electrically connected to the doped region 110 through the contact 156, and the conductive line 152 may be electrically connected to the gate 108 through the contact 154. In addition, in the hybrid memory structure 30, since the RRAM 104 may be operated through the conductive line 144 and the well region 124, the hybrid memory structure 30 may not include the conductive line 140 and the via 142 of FIG. 1. Furthermore, in the RRAM 104 of the hybrid memory structure 30, the width of the electrode 128 may be equal to the width of the electrode 130, but the invention is not limited thereto. In the hybrid memory structure 30, although the height of the top of the RRAM 104 is, for example, equal to the height of the top of the RRAM 106, the invention is not limited thereto. In other embodiments, the height of the top of the RRAM 104 may be higher or lower than the height of the top of the RRAM 106. On the other hand, in the hybrid memory structure 10 of FIG. 1 and the hybrid memory structure 30 of FIG. 5, the same or similar components are denoted by the same symbols, and the description thereof is omitted here.

Based on the above embodiments, in the hybrid memory structure 30, since the RRAM 104 and the RRAM 106 are electrically connected to the flash memory 102, respectively, the reliability of the RRAM 104, the RRAM 106, and the flash memory 102 can be increased, the bit density of the memory device can be increased, and the electrical performance of the SLC can be maintained. On the other hand, the manufacturing process of the hybrid memory structure 30 can be compatible with the manufacturing process of the CMOS device.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A hybrid memory structure, comprising:
    a substrate;
    a flash memory located on the substrate and comprising:
        a gate located on the substrate;
        a first doped region located in the substrate on one side of the gate; and
        a second doped region located in the substrate on another side of the gate;
    a first resistive random access memory (RRAM) electrically connected to one of the gate, the first doped region, and the second doped region; and
    a second RRAM electrically connected to another of the gate, the first doped region, and the second doped region, wherein
    the flash memory further comprises:
        a charge storage layer located between the gate and the substrate;
        a first dielectric layer located between the charge storage layer and the substrate; and
        a second dielectric layer located between the gate and the charge storage layer,
    the first RRAM comprises:
        a first electrode;
        a second electrode located on the first electrode; and
        a first variable resistance layer located between the first electrode and the second electrode,
    the first RRAM is electrically connected to the gate,
    the first electrode is electrically connected to the gate, and
    an electrode terminal to which the first electrode is first electrically connected is the gate of the flash memory.

2. The hybrid memory structure according to claim 1, wherein the charge storage layer comprises a floating gate or a charge trapping layer.

3. The hybrid memory structure according to claim 1, wherein the flash memory further comprises:
    a first lightly doped drain (LDD) located in the substrate between the first doped region and the gate;
    a second LDD located in the substrate between the second doped region and the gate; and
    a well region located in the substrate, wherein the first doped region, the second doped region, the first LDD, and the second LDD are located in the well region.

4. The hybrid memory structure according to claim 1, wherein the flash memory further comprises:
a spacer located on a sidewall of the gate.

5. The hybrid memory structure according to claim 1, wherein a height of a top of the first RRAM is equal to a height of a top of the second RRAM.

6. The hybrid memory structure according to claim 1, wherein a height of a top of the first RRAM is higher than a height of a top of the second RRAM.

7. The hybrid memory structure according to claim 1, wherein a height of a top of the first RRAM is lower than a height of a top of the second RRAM.

8. The hybrid memory structure according to claim 1, wherein
the second RRAM comprises:
a third electrode;
a fourth electrode located on the third electrode; and
a second variable resistance layer located between the third electrode and the fourth electrode.

9. The hybrid memory structure according to claim 8, wherein the second RRAM is electrically connected to the second doped region.

10. The hybrid memory structure according to claim 9, wherein the third electrode is electrically connected to the second doped region.

11. The hybrid memory structure according to claim 10, further comprising:
a first conductive line electrically connected to the first electrode;
a second conductive line electrically connected to the second electrode;
a third conductive line electrically connected to the fourth electrode; and
a fourth conductive line electrically connected to the first doped region.

12. The hybrid memory structure according to claim 8, wherein the second RRAM is electrically connected to the first doped region.

13. The hybrid memory structure according to claim 12, wherein the third electrode is electrically connected to the first doped region.

14. The hybrid memory structure according to claim 13, further comprising:
a first conductive line electrically connected to the first electrode;
a second conductive line electrically connected to the second electrode;
a third conductive line electrically connected to the fourth electrode; and
a fourth conductive line is electrically connected to the second doped region.

15. The hybrid memory structure according to claim 8, the first RRAM is electrically connected to the first doped region, and the second RRAM is electrically connected to the second doped region.

16. The hybrid memory structure according to claim 15, wherein the first electrode is electrically connected to the first doped region, and the third electrode is electrically connected to the second doped region.

17. The hybrid memory structure according to claim 16, further comprising:
a first conductive line electrically connected to the second electrode;
a second conductive line electrically connected to the fourth electrode; and
a third conductive line electrically connected to the gate.

18. The hybrid memory structure according to claim 8, wherein a material of the first electrode, the second electrode, the third electrode, and the fourth electrode comprises titanium, tantalum, platinum, iridium, ruthenium, tungsten, aluminum, zirconium, hafnium, nickel, copper, cobalt, iron, gadolinium, manganese, titanium nitride, tantalum nitride, titanium aluminum nitride, titanium tungsten alloy, or a combination thereof.

19. The hybrid memory structure according to claim 8, a material of the first variable resistance layer and the second variable resistance layer comprises hafnium oxide, tantalum oxide, titanium oxide, magnesium oxide, nickel oxide, niobium oxide, aluminum oxide, vanadium oxide, tungsten oxide, zinc oxide, cobalt oxide, or a combination thereof.

* * * * *